United States Patent [19]

Einthoven et al.

[11] Patent Number: 5,298,457
[45] Date of Patent: Mar. 29, 1994

[54] METHOD OF MAKING SEMICONDUCTOR DEVICES USING EPITAXIAL TECHNIQUES TO FORM SI/SI-GE INTERFACES AND INVERTING THE MATERIAL

[75] Inventors: William G. Einthoven, Belle Mead, N.J.; Joseph Y. Chan, Kings Park; Dennis Garbis, Huntington Station, both of N.Y.

[73] Assignee: G. I. Corporation, Hatboro, Pa.

[21] Appl. No.: 82,952

[22] Filed: Jul. 1, 1993

[51] Int. Cl.⁵ .......................................... H01L 21/205
[52] U.S. Cl. ........................... 437/131; 437/110; 437/976
[58] Field of Search ................ 437/89, 103, 106, 110, 437/131, 946, 965, 973, 976; 156/613; 148/DIG. 58, DIG. 59, DIG. 160, DIG. 169, 33.4, 33.5

[56] References Cited

U.S. PATENT DOCUMENTS

| | | | |
|---|---|---|---|
| 4,711,857 | 12/1987 | Cheng | 437/131 |
| 4,879,256 | 11/1989 | Bean et al. | 437/131 |
| 4,959,694 | 9/1990 | Gell | 257/19 |
| 4,962,051 | 10/1990 | Liaw | 437/976 |
| 5,102,810 | 4/1992 | Salih | 437/110 |
| 5,180,684 | 1/1993 | Fujioka | 437/110 |

Primary Examiner—Brian E. Hearn
Assistant Examiner—Chandra Chaudhari
Attorney, Agent, or Firm—James & Franklin

[57] ABSTRACT

The all epitaxial process starts with a high resistivity silicon substrate. Alternating layers of silicon and silicon-germanium are epitaxially grown on the substrate under conditions which create a region with misfit dislocations. A low resistivity silicon layer is then grown over the region. The material is inverted such that the high resistivity layer can be used to form the base of the device. The thickness of the high resistivity layer is adjusted to equal the width of the base of the semiconductor device to be fabricated.

16 Claims, 2 Drawing Sheets

METHOD OF MAKING SEMICONDUCTOR DEVICES USING EPITAXIAL TECHNIQUES TO FORM SI/SI-GE INTERFACES AND INVERTING THE MATERIAL

BACKGROUND OF THE INVENTION

The present invention relates to a material for use in manufacturing bipolar semiconductor devices such as high voltage fast switching rectifiers and an all epitaxial method for making same.

The production of material for use in manufacturing semiconductor devices by epitaxial techniques and diffusion is well known. A process which employs an all epitaxial method is disclosed in copending application Ser. No. 08/015,384 filed Feb. 9, 1993 in the name of Joseph Chan et al. entitled Multilayer Epitaxial Structure and Method for Fabricating same. That application is assigned to the assignee hereof. Moreover, it is known to employ epitaxial techniques to form depletion layers with silicon/silicon-germanium interfaces under conditions which result in regions of misfit dislocations to control the switching speed of the power semiconductor devices. In this regard, the reader is referred to U.S. Pat. No. 5,097,308 and U.S. Pat. No. 5,102,810, both issued to Ali Salih and entitled method For Controlling The Switching Speed of Bipolar Power Devices. Both patents are owned by the assignee hereof.

SUMMARY OF THE INVENTION

The overall object of the present invention is to provide an improved process for making a semiconductor material using all epitaxial techniques, similar to that disclosed in the above-mentioned application Ser. No. 08/015,384, to form regions of misfit dislocations similar to those disclosed in the above patents. The material is economical to produce and particularly well suited for fabrication of high voltage, fast switching rectifiers rated over 1000 volts with high yields and high reliability.

This object is achieved by combining several techniques in which a unique method in which the epitaxially material is inverted after formation such that what started as the substrate becomes the structure in which the base of the device is formed.

The process starts with a high resistivity substrate. The substrate is preferably Neutron Transmutation Doped silicon or Float Zone silicon. The surface of the high resistivity layer is prepared by slicing, diamond grinding and, if necessary etching. Alternating layers of substantially germanium free silicon and silicon containing germanium are epitaxially grown under conditions suitable to create regions of misfit dislocations. The misfit dislocations function to control switching speed of the device to be formed. A low resistivity layer is grown over the misfit dislocation region. The material is then inverted so that the low resistivity layer takes the place of the substrate and the high resistivity layer takes the place of the epi layer that is used to form the base of the semiconductor.

It is, therefore, a prime object of the present invention to provide an epitaxial process for making material useful in the fabrication of high voltage fast switching bipolar power semiconductor devices.

It is another object of the present invention to provide an epitaxial process in which the material is inverted so as to interchange the position of the high resistivity and low resistivity layers.

It is another object of the present invention to provide a method for making a material useful in fabricating high voltage rectifiers rated over 1000 volts, in which defect engineering is utilized to control switching speed, while avoiding the difficulty of growing very high resistivity, very thick epi layers.

In accordance with one aspect of the present invention, a method is provided of making material useful in fabricating a semiconductor device of the type having a high resistivity, thick base. The method begins by preparing the surface of a relatively high resistivity silicon layer. A multilayer silicon region is grown by vapor deposition adjacent the prepared surface under conditions which result in misfit dislocation regions. A relatively low resistivity silicon layer is grown adjacent the multilayer region. The material is then inverted. The thickness of the high resistivity layer is reduced to a thickness adequate for the width of the base of the device to be formed. The device can there after be formed in the material using the high resistivity silicon layer as the base.

The step of preparing the surface preferably comprises the step of slicing the high resistivity silicon and diamond grinding the surface. The ground surface is then gas etched in an epitaxial reactor or chemical mechanically polished.

The step of forming the multilayer region comprises the steps of forming a first substantially germanium free silicon layer and forming a first silicon, layer containing a few percent germanium, so as to create two silicon/silicon-germanium interface planes.

The step of forming the multilayer region further comprises the steps of forming a second substantially germanium free silicon layer and forming a second silicon layer, containing a few percent germanium, so as to create two more silicon/silicon-germanium interface planes.

A third substantially germanium free silicon layer is formed in two steps. The surface of this third layer is partially removed to form the surface of the multilayer region.

The method further comprises the step of forming a silicon buffer layer adjacent the multilayer region. The low resistivity layer is formed adjacent the buffer layer.

The step of reducing the thickness of the high resistivity layer comprises the step of grinding the surface of the low resistivity layer.

The method further comprises the step of etching the ground surface of the high resistivity layer. The high resistivity silicon layer for example comprises 100 ohm-cm N type Float Zone or Neutron Transmutation Doped silicon.

The silicon layer, containing a few percent germanium, is grown to a thickness of approximately 2 microns. Each of the layers containing no germanium is also grown to a thickness of approximately 2 microns. The step of forming the third layer, again containing no Ge, comprises the steps of growing a first portion approximately two microns thick and growing a second portion, which next is partially etched away, to form the surface of the third layer.

The low resistivity silicon layer has a resistivity of less than 0.005 ohm-cm. The low resistivity silicon layer is grown to a thickness of 100 microns.

To these and such other objects which hereinafter appear, the present invention relates to a material for use in manufacturing semiconductors and a method for making same, as set forth in detail in the following specification and recited in the annexed claims, taken together with the annexed drawings, in which like numerals relate to like parts and in which:

DETAILED DESCRIPTION OF THE PREFERRED EMBODIMENT

Figure 1:
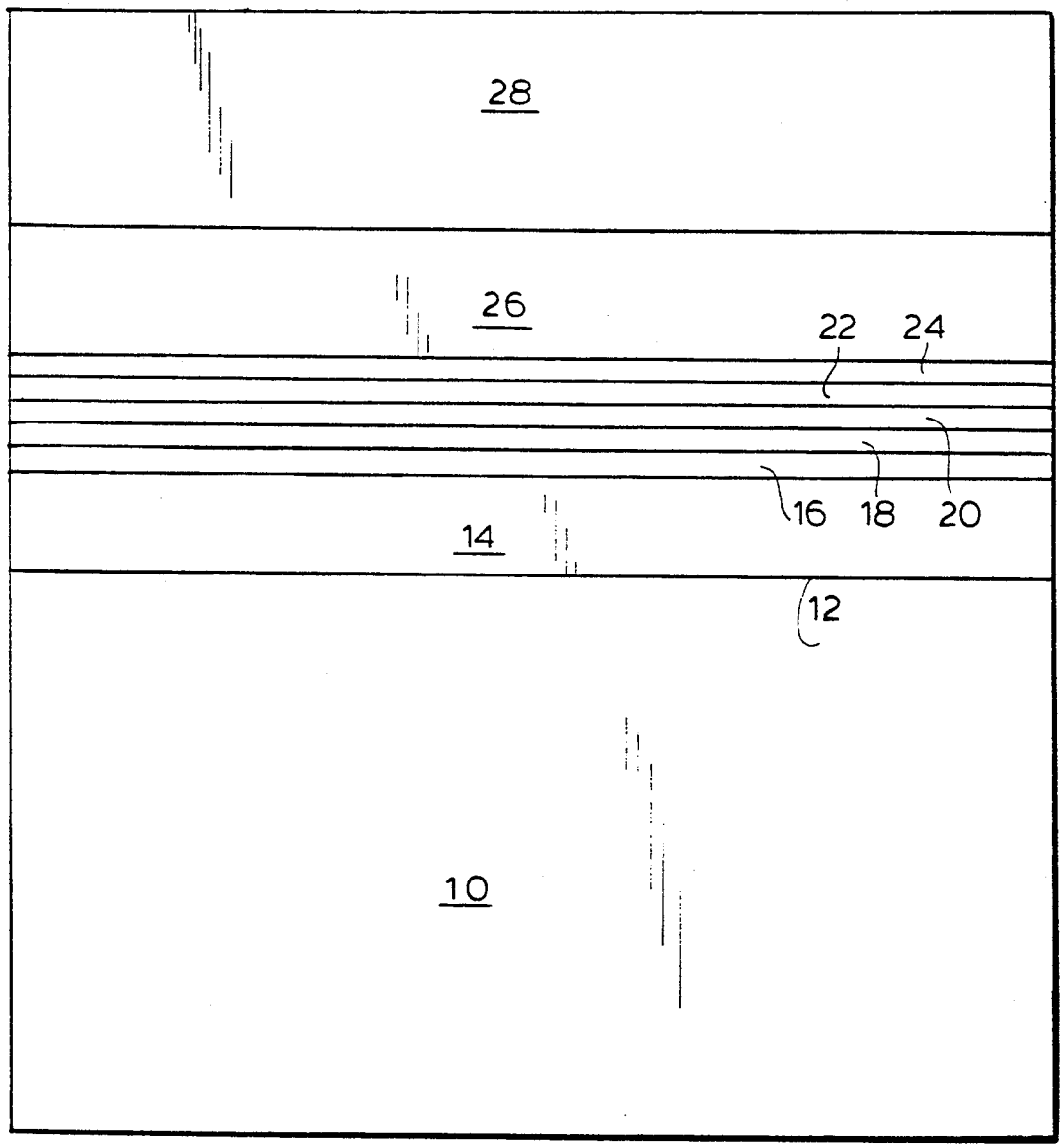
FIG. 1 is a schematic cross-sectional view of the material of the present invention after it has been formed but prior to inversion.

As seen in the figures, the starting material is a layer 10 of either Float Zone or Neutron Transmutated Doped silicon with a relatively high resistivity (100 ohm-cm) oriented at 1-1-1 or 1-0-0. In this example, it is N type, with a thickness of approximately 10 mils.

The surface 12 of layer 10 is prepared by slicing and chemical mechanical polishing or an equivalent two step diamond grinding process which is disclosed in the co-pending application Ser. No. 08/021,130 filed Mar. 8, 1993 in the name of G. Zakaluk et al. and owned by the assignee herein.

After obtaining a mirror finish on surface 12, a two step high temperature HCl gas etch is employed. Thereafter, a multilayer region including two silicon/silicon-germanium interfaces, is grown under conditions which result in the formation of misfit dislocations. Preferably, this region includes six separate N-type layers formed by vapor deposition techniques.

The first substantially germanium free silicon layer 14 has a resistivity of 10 ohm cm and a thickness of about 5 microns. Adjacent silicon layer 14, a first silicon layer 16, containing a few percent germanium is grown. Layer 16 has a resistivity of 10 ohm cm, contains approximately 3% germanium and has a thickness of about two microns.

Adjacent layer 16 is a second substantially germanium free silicon layer 18 having a resistivity of 10 ohm cm and a thickness of about two microns. Next to layer 18 is grown a second germanium containing layer 20. Layer 20 has a resistivity of 10 ohm cm, contains approximately 3% germanium and has a thickness of about two microns.

Adjacent layer 20 is formed a third germanium free silicon layer including a first silicon sublayer 22 of 10 ohm-cm resistivity, about 2 microns thick and a second silicon sublayer 24 also of 10 ohm-cm resistivity and 2 micron thickness.

The surface of sublayer 24 is subject to a HCl gas etch to remove a portion of the sublayer. This step also cleans up the deposition of germanium from the chamber, preventing it from acting as a future unwanted source.

Adjacent the etched surface of sublayer 24 is grown an N-type silicon buffer layer 26 of 10 ohm-cm resistivity. Layer 26 is in the range of 5 to 15 microns thick. Thereafter a relatively low resistivity (less than 0.005 ohm-cm) N+ layer 28 is grown to a thickness of 100 microns.

Figure 2:
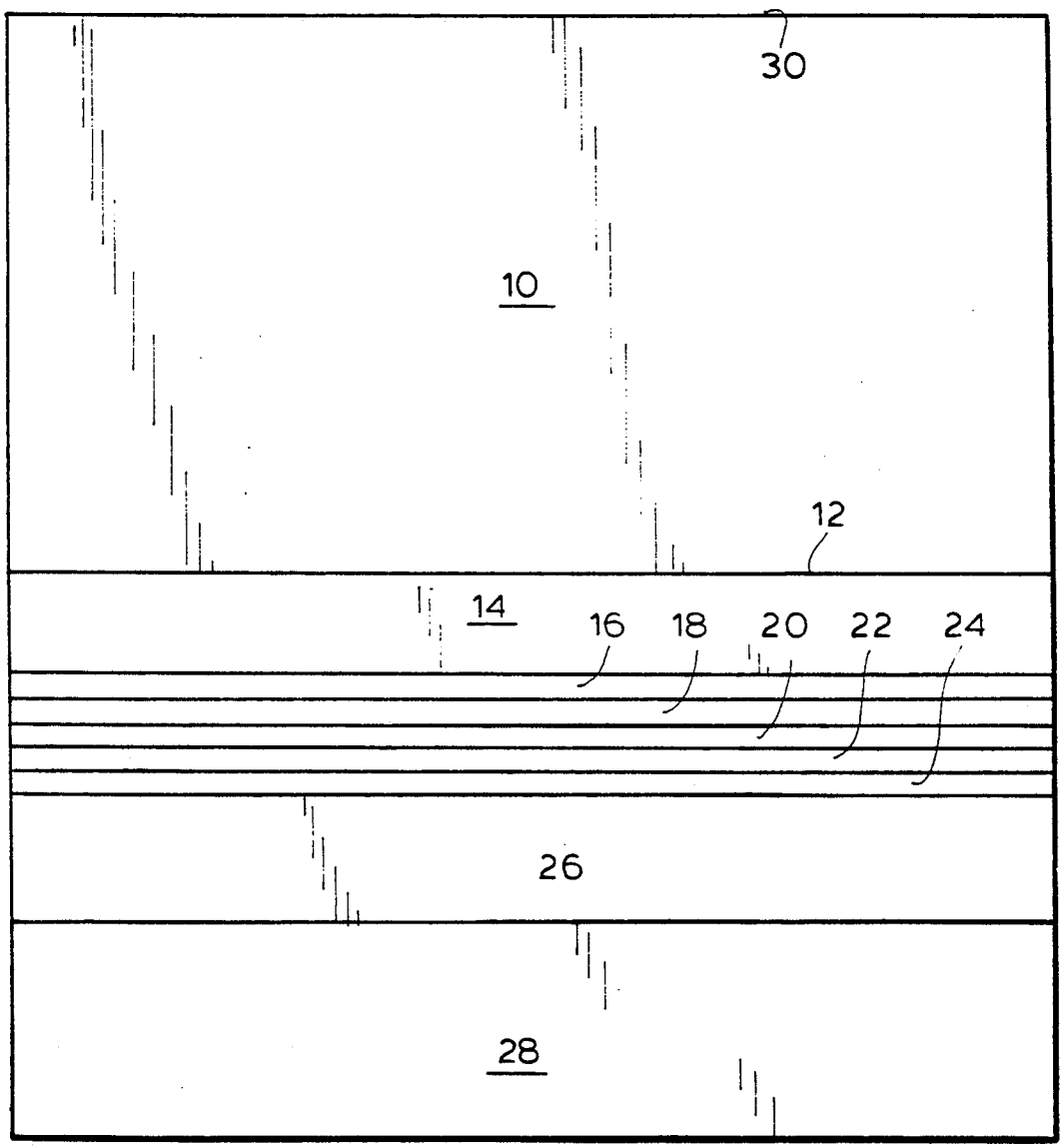
FIG. 2 is a schematic cross-sectional of the material of the present invention ready for device fabrication.

The resulting material generally has an N+/SiGe/N− structure. The material is then inverted as shown in FIG. 2 such that high resistivity N− layer 10 is situated on top and low resistivity N+ layer 28 is located below. The surface 30 of layer 10 is ground to remove a portion thereof such that it has the predetermined thickness required to support the desired voltage. That is, layer 10 will be thick enough so that after additional diffusions enough is left to serve as the high resistivity layer of the device. The surface of layer 10, surface 30, is subjected to a HCl gas etch, or to another damage removing etch, to further minimize damage from the grinding process.

The material is removed from the reactor. It is now ready for device processing. It has a N−/SiGe/N+ structure.

It will now be appreciated that the present invention relates to a material particularly adapted for use in manufacturing bipolar power semiconductor devices such as a high voltage fast switching rectifier rated at over 1000 volts and to a unique method for making same. The material starts with an N layer of high resistivity. A SiGe multilayer region containing misfit dislocations for switching speed control is grown. Then a low resistivity N-layer is formed. The material is then inverted and the thickness of the high resistivity layer adjusted such that the high resistivity layer becomes the base of the device.

While only a single preferred embodiment has been disclosed for purposes of illustration, many variations and modifications could be made thereto. It is intended to cover all of these variations and modifications which fall within the scope of the present invention as defined by the following claims:

We claim:

1. A method for making material useful in fabricating a semiconductor device of the type having a base with a given base width, the method comprising the steps of preparing the surface of a relatively high resistivity silicon layer; growing a multilayer silicon region by vapor deposition adjacent the prepared surface, under conditions which result in localized misfit dislocations; growing a relatively low resistivity silicon layer adjacent the multilayer region; inverting the material; and reducing the thickness of the high resistivity layer to a thickness, such that part of the device can be formed in the material using the high resistivity silicon layer and enough is left to serve as the base of the device.

2. The method of claim 1 wherein the step of preparing the surface comprises the step of slicing the high resistivity silicon and diamond grinding the surface.

3. The method of claim 2 wherein the step of preparing the surface further comprises the step of etching the ground surface.

4. The method of claim 1 wherein the step of forming the multilayer region comprises the steps of forming a first substantially germanium free silicon layer and forming a first silicon layer, containing a few percent germanium, so as to create a first silicon/silicon-germanium interface.

5. The method of claim 4 wherein the step of forming the multilayer region further comprises the steps of forming a second substantially germanium free silicon layer and forming a second silicon layer, containing a few percent germanium, so as to create a second silicon/silicon-germanium interface.

6. The method of claim 5 wherein the step of forming the multilayer region further comprises the step of forming a third substantially germanium free silicon layer and partially removing the surface thereof to form the surface of the multilayer region.

7. The method of claim 1 further comprising the step of forming a silicon buffer layer adjacent the multilayer region.

8. The method of claim 7 wherein the low resistivity layer is formed adjacent the buffer layer.

9. The method of claim 1 further comprising the step of reducing the thickness of the high resistivity layer comprises the step of diamond grinding the surface of the high resistivity layer.

10. The method of claim 9 further comprising the step of etching the ground surface of the high resistivity layer.

11. The method of claim 1 wherein the high resistivity silicon layer comprises 100 ohm cm N type Float Zone or Neutron Transmutation Doped silicon.

12. The method of claim 4 wherein the silicon layer, containing a few percent germanium is grown to a thickness of approximately 2 microns.

13. The method of claim 5 wherein each of the layers is grown to a thickness of approximately 2 microns.

14. The method of claim 6 wherein the step of forming the third layer comprises the steps of growing a first sublayer approximately two microns thick and growing a second sublayer to form the surface of the third layer.

15. The method of claim 1 wherein the low resistivity silicon layer has a resistivity of less than 0.005 ohm-cm.

16. The method of claim 1 wherein the low resistivity silicon layer is grown to a thickness of 100 microns.

* * * * *